(12) United States Patent
Liao et al.

(10) Patent No.: US 9,713,263 B2
(45) Date of Patent: Jul. 18, 2017

(54) CIRCUIT-AND-HEAT-DISSIPATION ASSEMBLY AND METHOD OF MAKING THE SAME

(71) Applicant: Taiwan Green Point Enterprises Co., Ltd., Taichung (TW)

(72) Inventors: Pen-Yi Liao, Taichung (TW);
Hung-San Pan, Taichung (TW);
Yu-Cheng Chen, Taichung (TW);
Hui-Ching Chuang, Taichung (TW);
Wen-Chia Tsai, Taichung (TW)

(73) Assignee: Taiwan Green Point Enterprises Co., Ltd., Taichung (TW)

( * ) Notice: Subject to any disclaimer, the term of this patent is extended or adjusted under 35 U.S.C. 154(b) by 0 days.

(21) Appl. No.: 14/744,469

(22) Filed: Jun. 19, 2015

(65) Prior Publication Data

US 2015/0373832 A1    Dec. 24, 2015

(30) Foreign Application Priority Data

Jun. 23, 2014    (TW) .............................. 103121575 A

(51) Int. Cl.
| | |
|---|---|
| *H05K 1/02* | (2006.01) |
| *H05K 3/10* | (2006.01) |
| *H05K 3/00* | (2006.01) |
| *H05K 3/18* | (2006.01) |

(52) U.S. Cl.
CPC ......... *H05K 3/0061* (2013.01); *H05K 1/0203* (2013.01); *H05K 1/0284* (2013.01); *H05K 3/185* (2013.01); *H05K 2201/09018* (2013.01); *H05K 2201/10106* (2013.01); *H05K 2201/10113* (2013.01); *H05K 2203/0709* (2013.01); *Y10T 29/49156* (2015.01)

(58) Field of Classification Search
CPC . H01L 2224/48227; H01L 2224/48472; H01L 23/142; H01L 2924/19105; H01L 23/14; H05K 1/092; H05K 1/053; H05K 1/09; H05K 1/05
See application file for complete search history.

(56) References Cited

U.S. PATENT DOCUMENTS

| | | | | |
|---|---|---|---|---|
| 5,766,740 A | * | 6/1998 | Olson | ................. H01L 23/3735 174/138 G |
| 5,857,767 A | * | 1/1999 | Hochstein | ............... F21V 29/70 362/294 |
| 7,527,873 B2 | * | 5/2009 | Kumar | ................... B32B 15/20 428/447 |

(Continued)

FOREIGN PATENT DOCUMENTS

| | | |
|---|---|---|
| TW | 200950631 | 5/1997 |
| TW | 201012372 | 3/2010 |
| TW | 201240168 A1 | 10/2012 |

*Primary Examiner* — Michael F McAllister
(74) *Attorney, Agent, or Firm* — Volpe and Koenig, P.C.

(57) ABSTRACT

A circuit-and-heat-dissipation assembly includes: a heat sink including a heat absorbing base and a heat dissipating element, the heat absorbing base having a circuit-forming surface and an element-forming surface, the heat dissipating element protruding from the element-forming surface for dissipating heat conducted from the heat absorbing base into an ambient environment; an insulator layer formed on the circuit-forming surface; and a patterned circuit formed on the insulator layer.

11 Claims, 9 Drawing Sheets

(56) References Cited

U.S. PATENT DOCUMENTS

| | | | | |
|---|---|---|---|---|
| 7,676,915 | B2* | 3/2010 | Ter-Hovhannissian | H05K 1/0203 257/707 |
| 8,661,660 | B2* | 3/2014 | Ter-Hovhannissian | H05K 1/053 257/707 |
| 2005/0122018 | A1* | 6/2005 | Morris | F21K 9/00 313/46 |
| 2007/0103875 | A1* | 5/2007 | Reis | H04N 5/2256 361/719 |
| 2011/0037367 | A1* | 2/2011 | Wang | F21V 29/63 313/46 |
| 2013/0107530 | A1* | 5/2013 | Wyrick | H05B 33/0803 362/249.02 |
| 2013/0279119 | A1* | 10/2013 | Grosu | H01L 23/36 361/722 |
| 2015/0040388 | A1* | 2/2015 | Jiang | H05K 1/056 29/832 |

* cited by examiner

CIRCUIT-AND-HEAT-DISSIPATION ASSEMBLY AND METHOD OF MAKING THE SAME

CROSS-REFERENCE TO RELATED APPLICATION

This application claims priority of Taiwanese Patent Application No. 103121575, filed on Jun. 23, 2014.

FIELD

Embodiments of the invention generally relate to a circuit-and-heat-dissipation assembly and a method of making the same, more particularly to a circuit-and-heat-dissipation assembly including a heat sink and a patterned circuit formed on the heat sink.

BACKGROUND

FIGS. 1A to 1F illustrate consecutive steps of a method of making an electronic assembly, such as a headlight electronic module. The method includes: enclosing an aluminum substrate 11 with an insulator layer 12 (see FIG. 1A); forming a copper layer 13 on the insulator layer 12 so as to form a circuit preform 10 (see FIG. 1B); attaching the circuit preform 10 to a planar plate 151 of a heat sink 15 through a 14 (see FIG. 1C); patterning the copper layer 13 to form a circuit pattern 131 on the insulator layer 12 using semiconductor processing techniques (see FIG. 1D), the circuit pattern 131 having enlarged soldering ends 132 (serving as bonding pads 132); forming a solder mask layer 134 on the circuit pattern 131 (see FIG. 1E); and mounting a plurality of electronic components 17, such as LED chips, on the circuit pattern 131 using surface mounting techniques, such that the electronic components 17 are bonded to the bonding pads 132, respectively (see FIG. 1F with reference to FIG. 1E).

There may be a need for providing a method of making an electronic assembly that is simple and cost effective.

SUMMARY

In certain embodiments of the disclosure, a circuit-and-heat-dissipation assembly may be provided. Such a circuit-and-heat-dissipation assembly may include: a heat sink including a heat absorbing base and a heat dissipating element, the heat absorbing base having a circuit-forming surface and an element-forming surface opposite to the circuit-forming surface, the heat dissipating element being connected to and protruding from the element-forming surface for dissipating heat conducted from the heat absorbing base into an ambient environment; an insulator layer formed on the circuit-forming surface; and a patterned circuit formed on the insulator layer.

In certain embodiments of the disclosure, a method of making a circuit-and-heat-dissipation assembly may be provided. Such a method may include: preparing a heat sink that includes a heat absorbing base and a heat dissipating element, the heat absorbing base having a circuit-forming surface and an element-forming surface, the heat dissipating element protruding from the element-forming surface for dissipating heat conducted from the heat absorbing base into an ambient environment; forming an insulator layer on the circuit-forming surface; and forming a patterned circuit on the insulator layer.

In certain embodiments of the disclosure, a circuit-and-heat-dissipation assembly may be provided. Such a circuit-and-heat-dissipation assembly may include: a heat sink including a circuit-forming surface; an insulator layer formed on the circuit-forming surface; a patterned circuit formed on the insulator layer, the patterned circuit including at least one pair of spaced apart conductive lines; and a heat-dissipating block formed on the circuit-forming surface and extending therefrom through the insulator layer toward the conductive lines.

BRIEF DESCRIPTION OF THE DRAWINGS

Other features and advantages of the disclosure will become apparent in the following detailed description of the exemplary embodiments with reference to the accompanying drawings, of which.

DETAILED DESCRIPTION

Figure 1A:
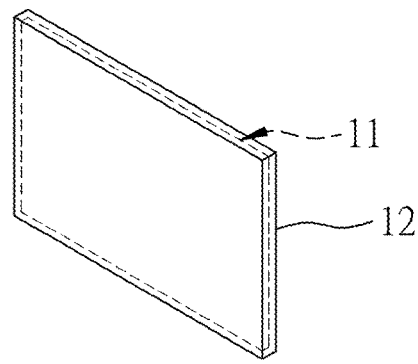
FIGS. 1A to 1F are perspective views illustrating consecutive steps of a method of making an electronic assembly.
Figure 1B:
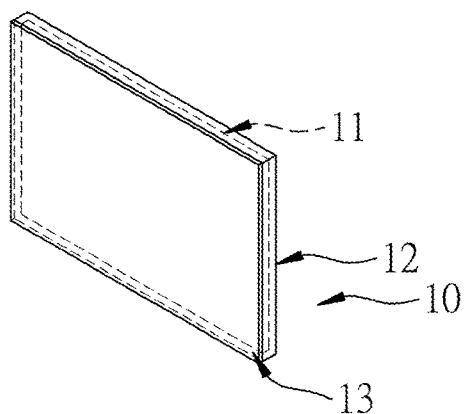
Figure 1C:
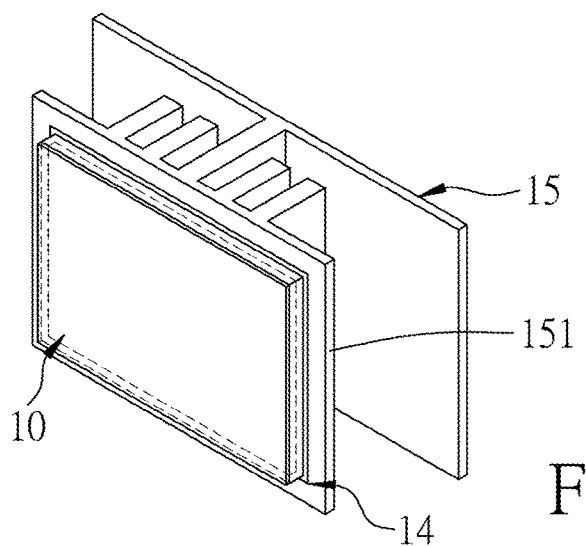
Figure 1D:
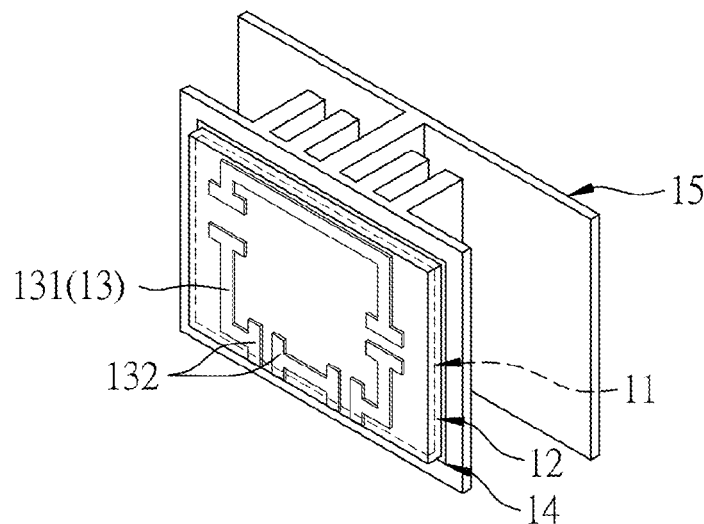
Figure 1E:
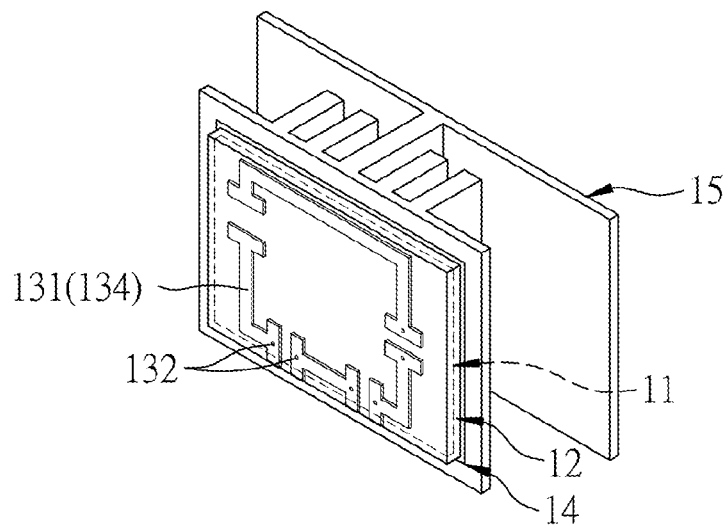
Figure 1F:
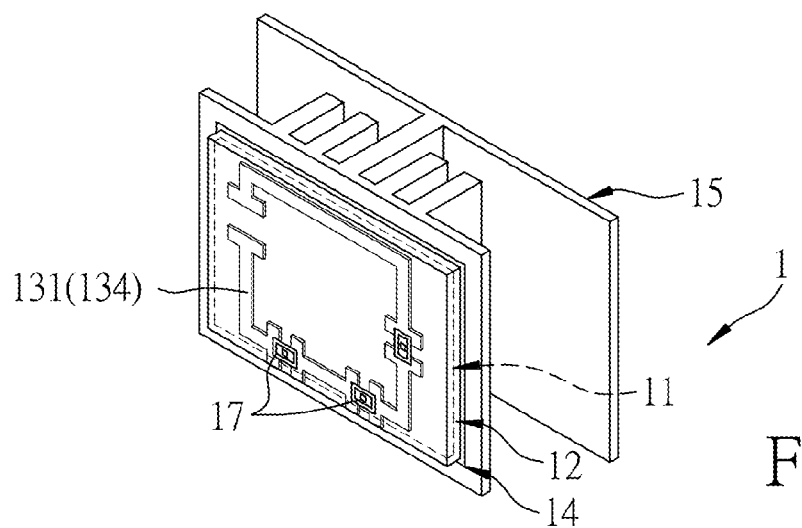

It may be noted that like elements are denoted by the same reference numerals throughout the disclosure.

FIGS. 2A to 2E illustrate consecutive steps of certain embodiments of a method of making a circuit-and-heat-dissipation assembly, such as a headlight electronic module. The method may include the following consecutive steps (see FIGS. 2A to 2E). A heat sink 2 is prepared (see FIG. 2A), and includes a heat absorbing base 21 having a circuit-forming surface 211 and an element-forming surface 212 opposite to the circuit-forming surface 211, and a heat dissipating element 22 connected to and protruding from the heat absorbing base 21 for dissipating heat conducted from the heat absorbing base 21 into an ambient environment. An insulator layer 3 is then formed on the circuit-forming surface 211 (see FIG. 2B). After that, a patterned catalyst seed layer 41 comprising an active metal is formed on the insulator layer 3 (see FIG. 2C). A reduced metal layer 42 is then formed on the patterned catalyst seed layer 41 (see FIG. 2D) by reducing metal ions in an electroless plating bath (not shown) through the catalyst seed layer 41. The reduced metal layer 42 cooperates with the patterned catalyst seed layer 41 to define a patterned electroless plating layer 51. Thereafter, a plurality of electronic components 6, such as LED chips, are mounted on the patterned electroless plating layer 51 (see FIG. 2E).

In these embodiments, the patterned electroless plating layer 51 alone serves as a patterned circuit 5 for direct mounting of the electronic components 6 thereon. Particularly, the patterned circuit 5 includes pairs of spaced apart conductive lines 50, each of which has an enlarged soldering end 501. Each of the electronic components 6 may be bonded or soldered to the enlarged soldering ends 501 of a corresponding pair of the conductive lines 50 using techniques, such as surface mount technology. The conductive lines 50 may have a thickness ranging from 18 µm to 20 µm and a line width ranging from 3 mm to 10 mm.

In certain embodiments, the active metal may be selected from the group consisting of palladium, rhodium, platinum, iridium, osmium, gold, nickel, iron, and combinations thereof. The reduced metal layer 42 formed from the electroless plating may contain a metallic material having a heat conductivity (K) greater than 95 W/m·K and a resistance ($\rho$) less than 75 n$\Omega$·m. One Example of the metallic material may be copper (K=400 W/m·K, $\rho$=16.78 n$\Omega$·m).

In certain embodiments, the heat dissipating element 22 may be in the form of a structure selected from the group consisting of fins, a heat pipe, and combinations thereof. In certain embodiments, the heat dissipating element 22 may be in the form of fins.

In certain embodiments, the heat sink 2 is a single piece. In certain embodiments, the heat sink 2 may be made from aluminum extrudate.

In certain embodiments, the insulator layer 3 may be formed on the circuit-forming surface 211 using electrophoretic deposition techniques, and may be made from a resin material, such as epoxy. The insulator layer may extend continuously from the circuit-forming surface 211 to the element-forming surface 212. In certain embodiments, the insulator layer 3 may enclose an entire outer surface of the heat sink 2.

Figure 2A:
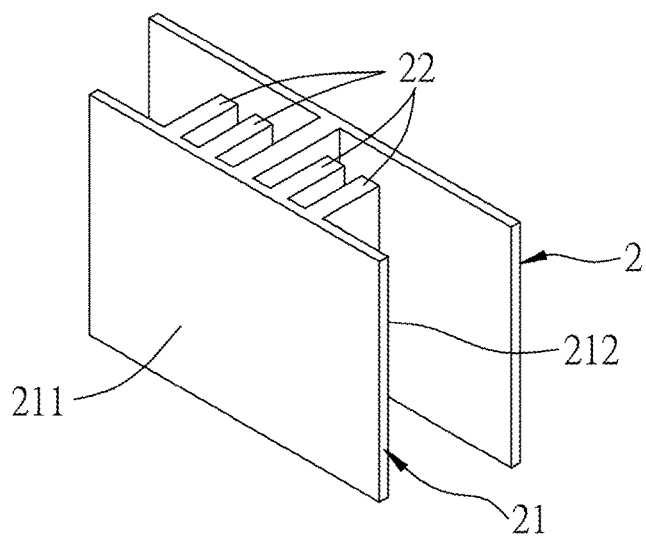
FIGS. 2A to 2E are perspective views illustrating consecutive steps of a method of making a circuit-and-heat-dissipation assembly in certain embodiments according to the disclosure.
Figure 2B:
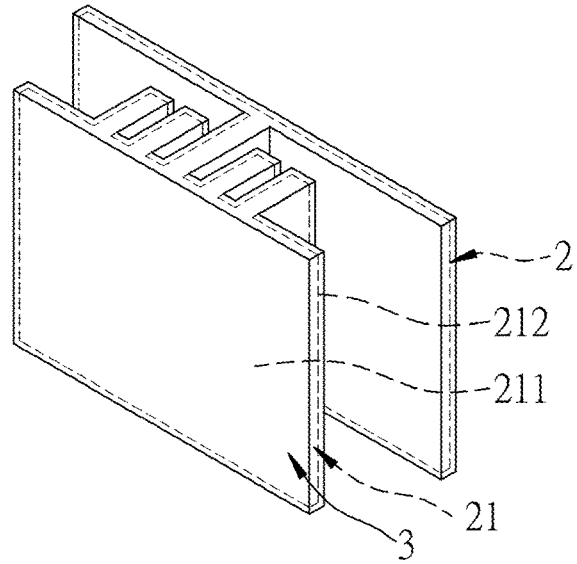
Figure 2C:
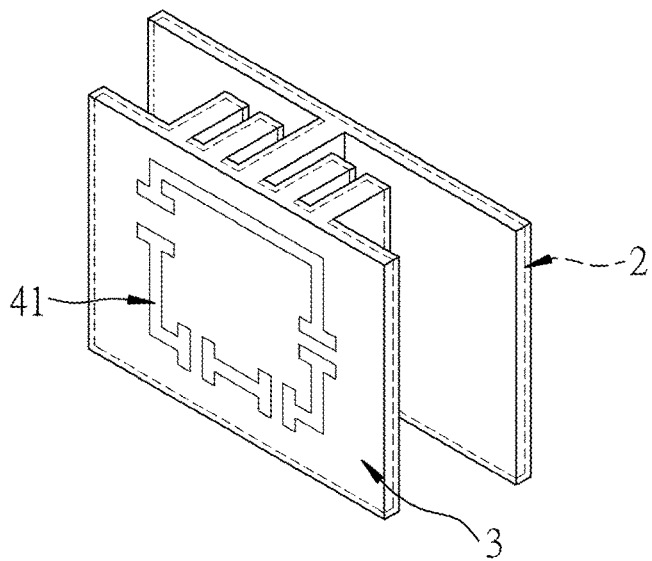
Figure 2D:
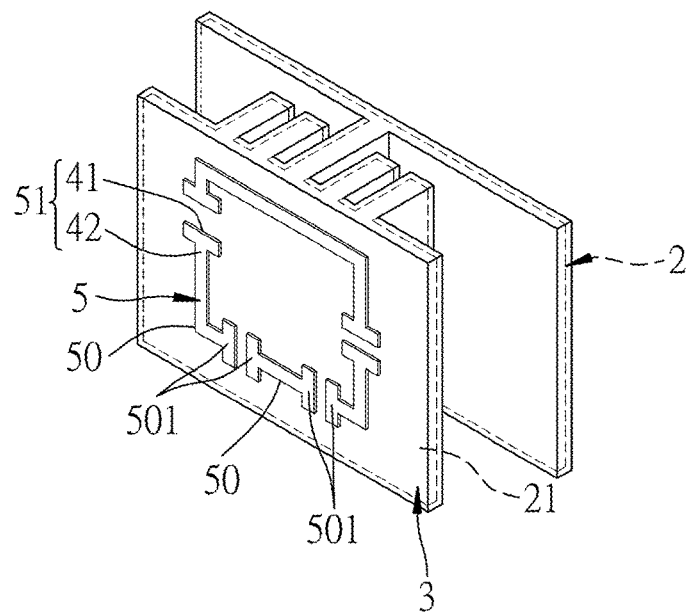
Figure 2E:
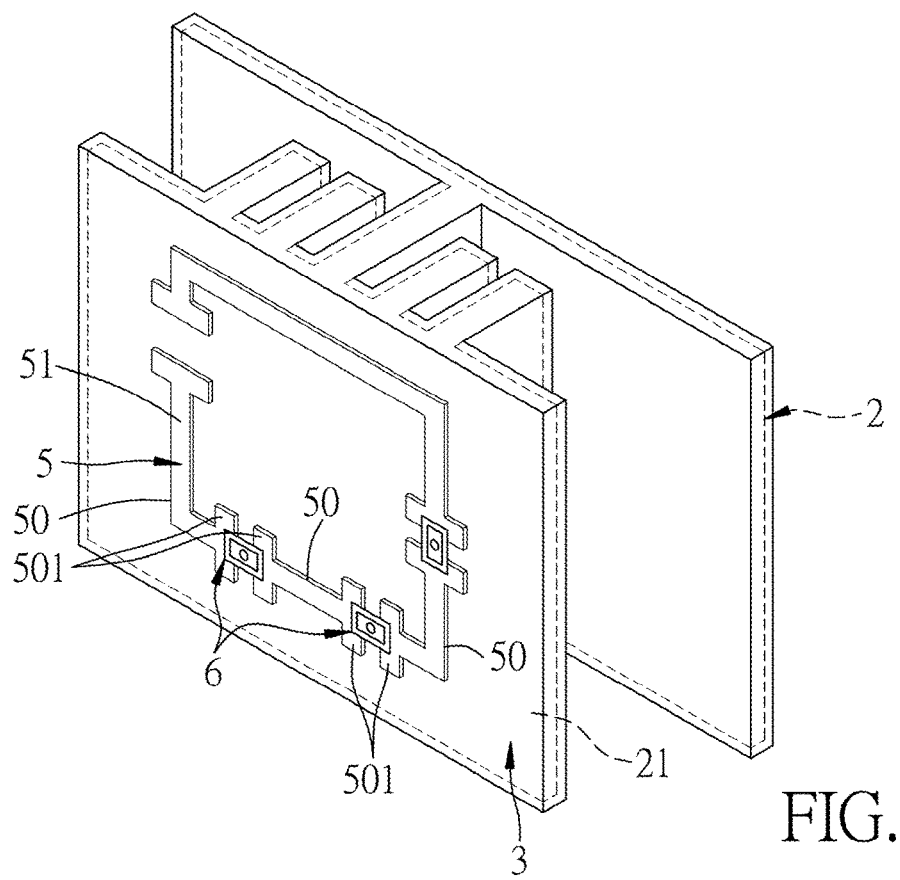
Figure 3:
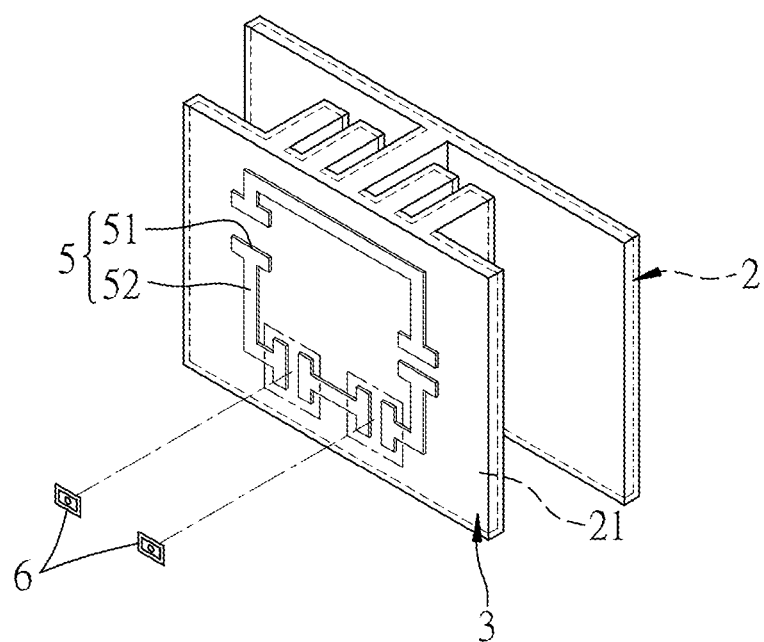
FIG. 3 is a perspective view illustrating a step of forming an electroplating layer that may be included in the method of making the circuit-and-heat-dissipation assembly in certain embodiments according to the disclosure.

In certain embodiments, referring to FIG. 3, in combination with FIG. 2E, the method may further include forming a patterned electroplating layer 52 on the electroless plating layer 51 using electroplating techniques. In these embodiments, the patterned electroplating layer 52 and the electroless plating layer 51 cooperatively define the patterned circuit 5 for mounting of the electronic components 6 thereon.

In certain embodiments, the patterned electroplating layer 52 may be made from nickel (K=99.9 W/m·K, $\rho$=69.3 n$\Omega$·m).

Figure 4A:
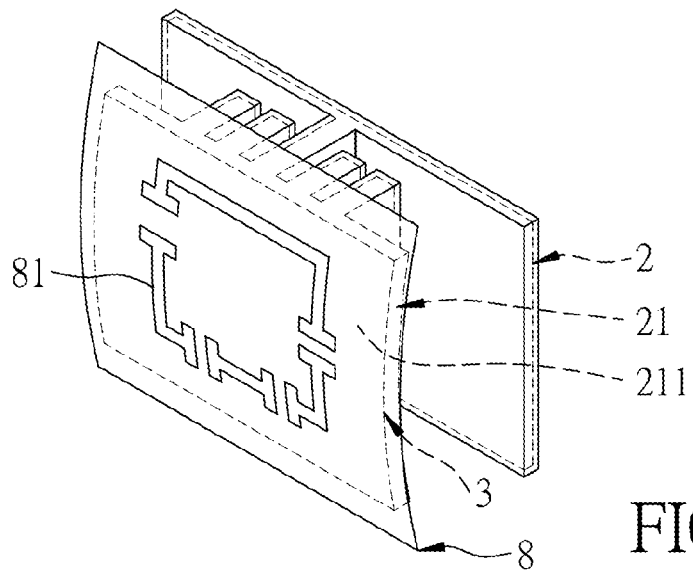
FIGS. 4A to 4C are perspective views illustrating consecutive steps of forming a patterned catalyst seed layer that may be included in the method of making the circuit-and-heat-dissipation assembly in certain embodiments according to the disclosure.
Figure 4B:
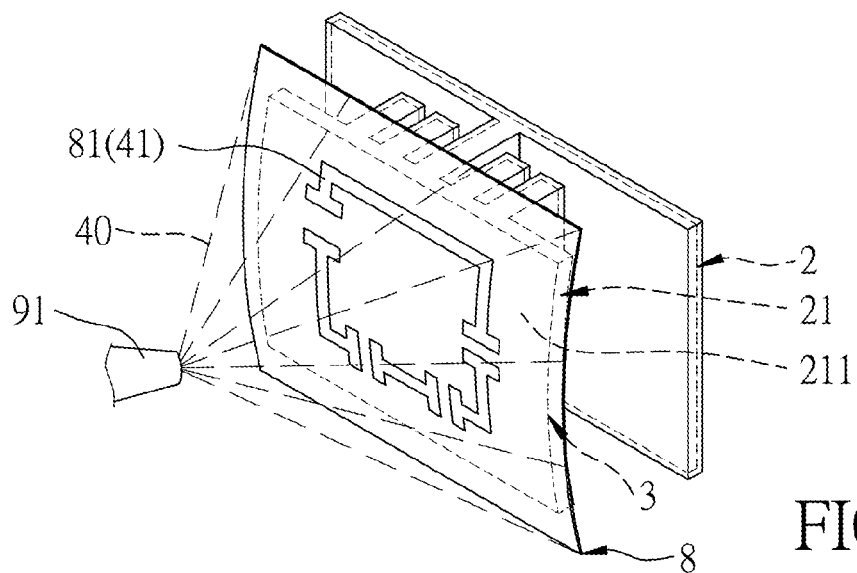
Figure 4C:
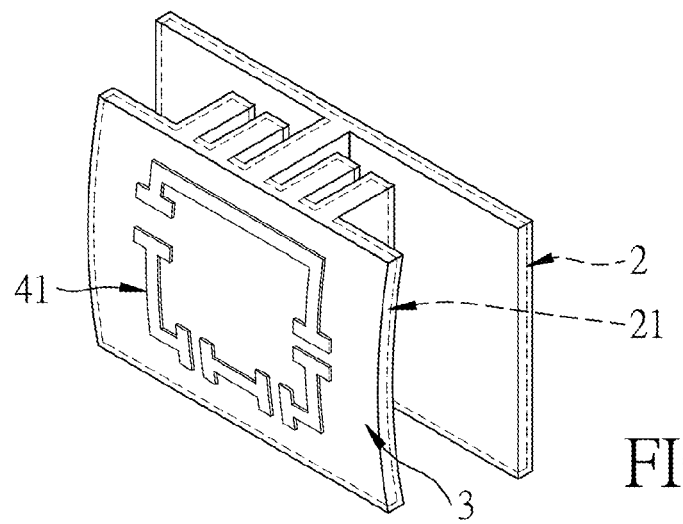

In certain embodiments, referring to FIGS. 4A to 4C, the heat absorbing base 21 is curved in shape and the patterned catalyst seed layer 41 may be formed on the insulator layer 3 by: covering the insulator layer 3 with a patterned mask 8 (see FIG. 4A), the patterned mask 8 being formed with a pattern of through-holes 81 that corresponds to a pattern of the patterned catalyst seed layer 41; applying a curable ink 40 containing the active metal onto the patterned mask 8 to fill the through-holes 81 with the curable ink 40 using a sprayer 91 (see FIG. 4B); removing the patterned mask 8 from the insulator layer 3 (see FIG. 4C); and curing the curable ink 40 to form the patterned catalyst seed layer 41 (see FIG. 4C). Alternatively, the patterned catalyst seed layer 41 may be formed by applying a powder coating material containing the active metal onto the patterned mask 8 or by immersing the assembly of the patterned mask 8, the insulator layer 3 and the heat sink 2 in a solution containing the active metal.

Figure 5A:
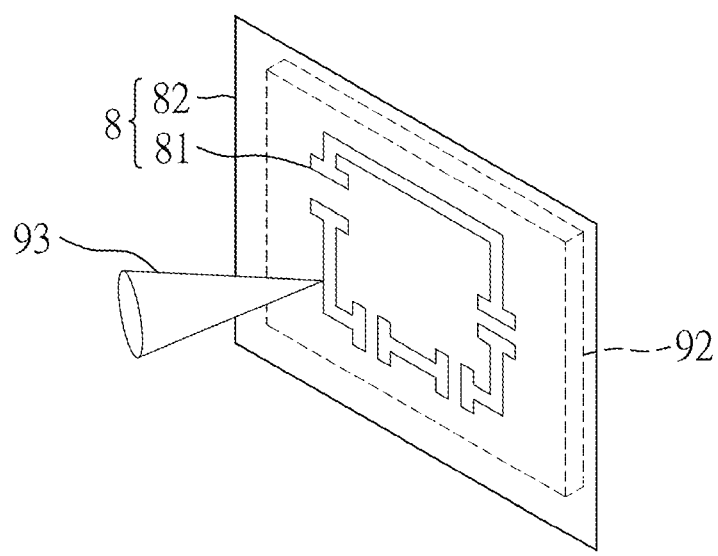
FIGS. 5A and 5B are perspective views illustrating steps of patterning a flexible sheet to form a patterned mask and attaching the patterned mask onto a heat sink that may be included in the method of making the circuit-and-heat-dissipation assembly in certain embodiments according to the disclosure.
Figure 5B:
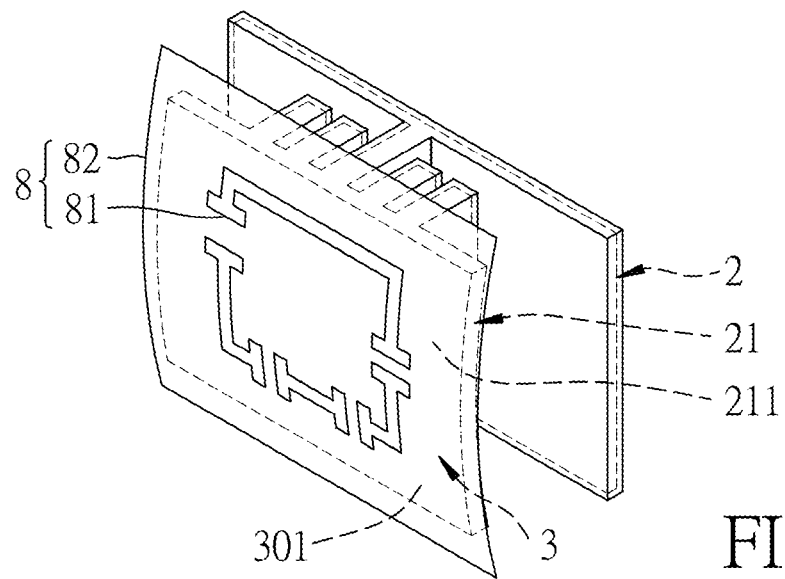
Figure 6:
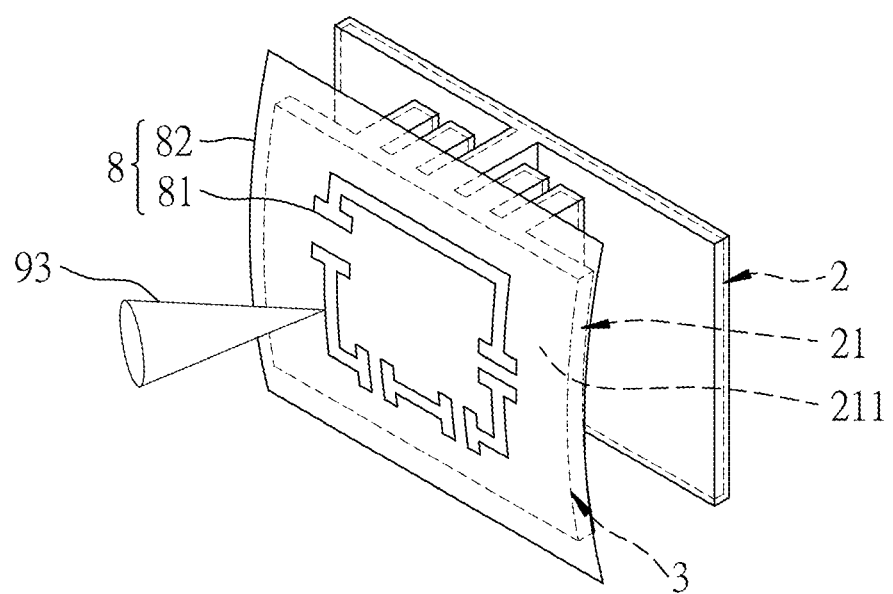
FIG. 6 is a perspective view illustrating a step of patterning a flexible sheet to form a patterned mask that may be included in the method of making the circuit-and-heat-dissipation assembly in certain embodiments according to the disclosure.

In certain embodiments, referring to FIGS. 5A and 5B, the patterned mask 8 may be formed by placing a flexible sheet 82 against a planar surface of a substrate 92, followed by patterning the flexible sheet 82 using a laser beam 93 through laser ablation or laser burnout techniques (see FIG. 5A). In certain embodiments, the circuit-forming surface 211 of the heat absorbing base 21 may be curved in shape (see FIG. 5B), so that a covering surface 301 of the insulator layer 3 that covers the circuit-forming surface 211 may also be curved in shape. Since the patterned mask 8 thus formed is flexible, the same can conform to a curved profile of the covering surface 301 or the circuit-forming surface 211 when covering the insulator layer 3. Alternatively, the flexible sheet 82 may be directly placed against the covering surface 301 of the insulator layer 3 (which has a curved profile) during laser ablation (see FIG. 6).

In certain embodiments, the patterned mask 8 may be made from a material selected from the group consisting of polyethylene terephthalate and rubber.

Figure 7:
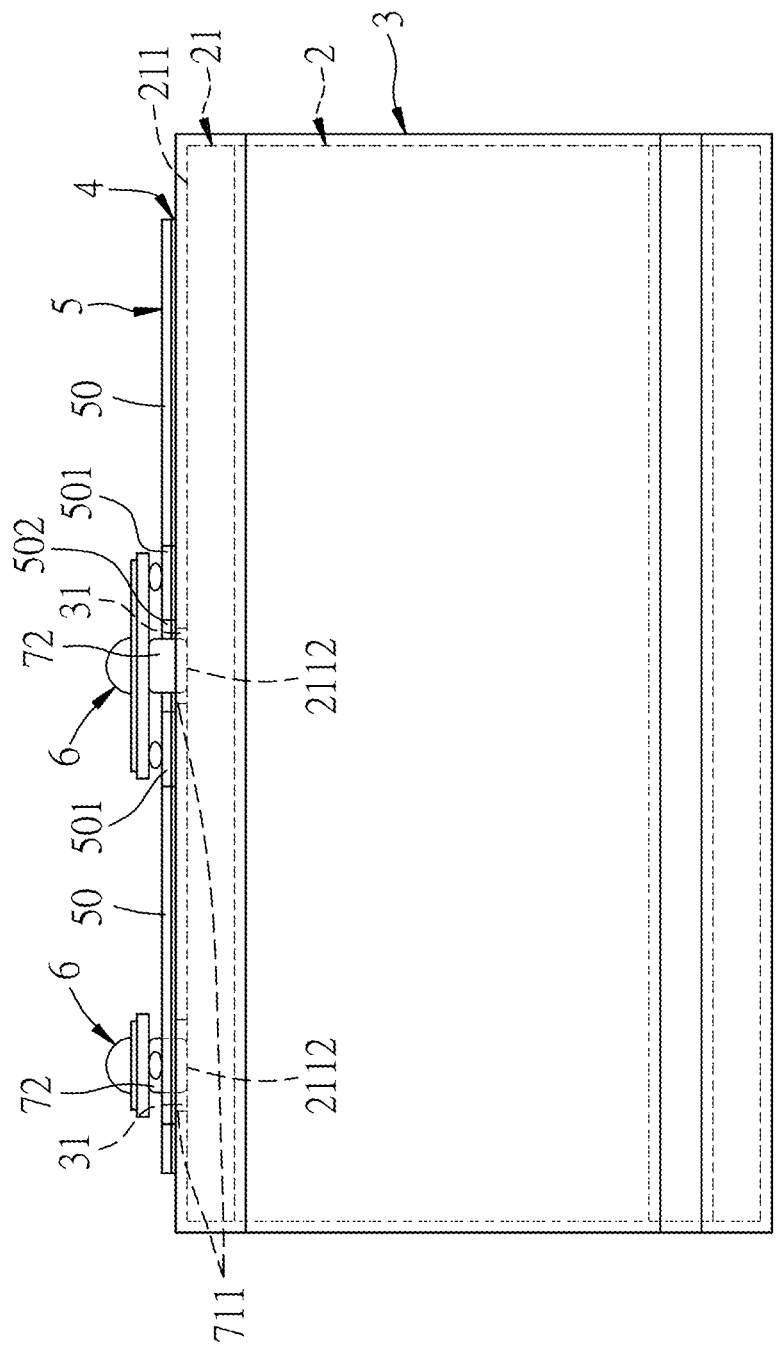
FIG. 7 is a schematic view illustrating a step of forming a heat dissipating block that may be included in the method of making the circuit-and-heat-dissipation assembly in certain embodiments according to the disclosure.

In certain embodiments, referring to FIG. 7, the method may further include the steps of: forming a plurality of holes 31 in the insulator layer 3, such that the holes 31 expose a plurality of contact regions 2112 of the circuit-forming surface 211, each of the holes 31 being aligned with a gap 502 defined by two enlarged soldering ends 501 of a corresponding pair of the conductive lines 50 of the patterned circuit 5; and forming a plurality of heat dissipating blocks 72 on the contact regions 2112, respectively, such that each of the heat dissipating blocks 72 extends toward a corresponding pair of the conductive lines 50 from the corresponding contact region 2112 through the corresponding hole 31 in the insulator layer 3 and into the corresponding gap 502 to contact a heat sink or heat dissipating substrate (not shown) of a corresponding one of the electronic components 6.

In certain embodiments, the heat dissipating blocks 72 may be made from a thermal grease, and may be formed by coating techniques.

In certain embodiments, the holes 31 in the insulator layer 3 may be formed after formation of the patterned circuit 5 using laser ablation techniques. Alternatively, the holes 31 in the insulator layer 3 may be formed before formation of the patterned circuit 5. For instance, the method may include: forming a non-patterned catalyst seed layer (not shown) on the insulator layer 3; forming a non-patterned reduced metal layer (not shown) on the non-patterned catalyst seed layer 41; and patterning the non-patterned reduced metal layer and the non-patterned catalyst seed layer 41 and forming the holes 31 in the insulator layer 3 using laser ablation techniques.

In certain embodiments, the heat generated from the electronic components 6 may be conducted through the patterned circuit 5, the insulator layer 3 and the heat sink 2 into the atmosphere, which renders the circuit-and-heat-dissipation assembly of the certain embodiments more efficient in heat dissipation as compared to the aforesaid electronic assembly.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A circuit-and-heat-dissipation assembly, comprising:
    a heat sink including a heat absorbing base and a heat dissipating element, said heat absorbing base having a circuit-forming surface and an element-forming surface, said heat dissipating element protruding from said element-forming surface for dissipating heat conducted from said heat absorbing base into an ambient environment;
    an insulator layer formed on said circuit-forming surface; and
    a patterned circuit formed on said insulator layer and having an electroless plating layer, said electroless plating layer having a patterned catalyst seed layer comprising an active metal and formed on said insulator layer, and a reduced metal layer formed on said catalyst seed layer.

2. The circuit-and-heat-dissipation assembly as claimed in claim 1, wherein said heat dissipating element is in the form of fins.

3. The circuit-and-heat-dissipation assembly as claimed in claim 1, wherein said heat sink is a single piece.

4. The circuit-and-heat-dissipation assembly as claimed in claim 1, wherein said patterned circuit further has an electroplating layer formed on said electroless plating layer.

5. The circuit-and-heat-dissipation assembly as claimed in claim 1, wherein said insulator layer extends continuously from said circuit-forming surface to said element-forming surface.

6. The circuit-and-heat-dissipation assembly as claimed in claim 1, further comprising at least one heat-dissipating block, said patterned circuit including at least one pair of spaced apart conductive lines, each of which has a soldering end, said soldering ends of said conductive lines cooperatively defining a gap therebetween, said insulator layer being formed with a hole that is aligned with said gap and that exposes a contact region of said circuit-forming surface, said heat-dissipating block being formed on said contact region of said circuit-forming surface and extending therefrom through said hole in said insulator layer and into said gap.

7. The circuit-and-heat-dissipation assembly as claimed in claim 1, wherein said heat absorbing base is curved in shape.

8. A circuit-and-heat-dissipation assembly, comprising:
    a heat sink including a circuit-forming surface;
    an insulator layer formed on said circuit-forming surface;
    a patterned circuit formed on said insulator layer and having an electroless plating layer, said patterned circuit including at least one pair of spaced apart conductive lines, said electroless plating layer having a patterned catalyst seed layer comprising an active metal and formed on said insulator layer, and a reduced metal layer formed on said catalyst seed layer; and
    a heat-dissipating block formed on said circuit-forming surface and extending therefrom through said insulator layer toward said conductive lines.

9. The circuit-and-heat-dissipation assembly as claimed in claim 8, wherein each of said conductive lines has a soldering end, said soldering ends of said conductive lines cooperatively defining a gap therebetween, said heat-dissipating block extending into said gap.

10. The circuit-and-heat-dissipation assembly as claimed in claim 9, wherein said insulator layer is formed with a hole that is aligned with said gap and that exposes a contact region of said circuit-forming surface, said heat-dissipating block extending from said contact region through said hole in said insulator layer and into said gap.

11. The circuit-and-heat-dissipation assembly as claimed in claim 8, wherein said heat-dissipating block is a thermal grease.

* * * * *